United States Patent
Tanwar et al.

(10) Patent No.: US 9,275,874 B2
(45) Date of Patent: Mar. 1, 2016

(54) METHODS FOR FABRICATING INTEGRATED CIRCUITS USING CHEMICAL MECHANICAL PLANARIZATION TO RECESS METAL

(71) Applicants: GLOBALFOUNDRIES, Inc., Grand Cayman, KY (US); International Business Machines Corporation, Armonk, NY (US)

(72) Inventors: Kunaljeet Tanwar, Slingerlands, NY (US); Xunyuan Zhang, Albany, NY (US); Donald Canaperi, Averill Park, NY (US); Raghuveer Patlolla, Guilderland, NY (US)

(73) Assignees: GLOBALFOUNDRIES, INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 119 days.

(21) Appl. No.: 14/015,640

(22) Filed: Aug. 30, 2013

(65) Prior Publication Data

US 2015/0064903 A1   Mar. 5, 2015

(51) Int. Cl.
*H01L 21/302*  (2006.01)
*H01L 21/461*  (2006.01)
*H01L 21/321*  (2006.01)

(52) U.S. Cl.
CPC ...... *H01L 21/3212* (2013.01); *H01L 21/32115* (2013.01)

(58) Field of Classification Search
CPC .................. H01L 211/32115; H01L 21/3212
USPC .............................................. 216/89; 438/692
See application file for complete search history.

(56) References Cited

U.S. PATENT DOCUMENTS

| | | | |
|---|---|---|---|
| 6,261,158 B1 * | 7/2001 | Holland et al. | 451/63 |
| 6,670,274 B1 * | 12/2003 | Liu et al. | 438/692 |
| 2002/0173221 A1 * | 11/2002 | Li et al. | 451/5 |
| 2004/0043611 A1 * | 3/2004 | Stoeckgen et al. | 438/687 |

* cited by examiner

*Primary Examiner* — Roberts Culbert
(74) *Attorney, Agent, or Firm* — Ingrassia Fisher & Lorenz, P.C.

(57) ABSTRACT

Methods for fabricating integrated circuits using chemical mechanical planarization (CMP) for recessing metal are provided. In an embodiment, a method for fabricating an integrated circuit includes filling a trench with a metal and forming an overburden portion of the metal outside of the trench. The method further includes performing a planarization process with an etching slurry to remove the overburden portion of the metal and to recess the metal within the trench.

19 Claims, 3 Drawing Sheets

METHODS FOR FABRICATING INTEGRATED CIRCUITS USING CHEMICAL MECHANICAL PLANARIZATION TO RECESS METAL

TECHNICAL FIELD

The technical field generally relates to methods for fabricating integrated circuits, and more particularly relates to methods for fabricating integrated circuits using chemical mechanical planarization to recess metals.

BACKGROUND

Integrated circuits typically include a plurality of semiconductor devices and interconnect wiring. Networks of metal interconnect wiring are often used to connect the semiconductor devices. Multiple levels of metal interconnect wiring above the semiconductor portion of the substrate are connected together to form a back-end-of-the-line ("BEOL") interconnect structure. Within such a structure, metal lines run parallel to the substrate and conductive vias run perpendicular to the substrate. The conductive vias typically interconnect the different levels of the metal wiring levels.

Two developments have contributed to increased performance of contemporary integrated circuits due to improved interconnects. One such development is the use of copper as the interconnect metal of the BEOL interconnect structure. Copper is advantageous because it has a higher conductivity compared with the other traditionally used interconnect metals, such as, for example, aluminum. A second development is the employment within the BEOL interconnect structure of a low dielectric constant (low k) dielectric material as the interlayer dielectric (ILD) layer or layers. By "low k," it is meant that the dielectric constant of a particular dielectric material is less than that of silicon dioxide.

When copper is used as the metal in the interconnect wiring layers, a dielectric barrier layer or "dielectric cap" is typically required between the copper features and the ILD to prevent copper from diffusing into certain types of ILD materials so as to prevent the copper from damaging the insulative electrical properties of the dielectric. Therefore, the typical fabrication process involves depositing copper into trenches formed in the interlayer dielectric, planarizing the copper, and etching the copper to recess it within the respective trenches before a dielectric cap is formed over the copper and within the trench. This process is time consuming and can present a bottleneck in fabrication processing.

Accordingly, it is desirable to provide methods for fabricating integrated circuits that form metal interconnect structures more efficiently. Also, it is desirable to provide methods for fabricating integrated circuits that use chemical mechanical planarization (CMP) to recess metal within trenches. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits using chemical mechanical planarization (CMP) for recessing metal are provided. In one exemplary embodiment, a method for fabricating an integrated circuit includes filling a trench with a metal and forming an overburden portion of the metal outside of the trench. The method further includes performing a planarization process with an etching slurry to remove the overburden portion of the metal and to recess the metal within the trench.

In accordance with another embodiment, a method for fabricating an integrated circuit includes providing a partially completed integrated circuit including an interlayer dielectric defining a trench and filling the trench with copper. The method further includes recessing the copper within the trench with a chemical mechanical planarization (CMP) process performed with an etching slurry. The copper within the trench is non-mechanically etched by the etching slurry.

In another embodiment, a method for fabricating an integrated circuit includes introducing a partially completed integrated circuit to a chemical mechanical planarization (CMP) unit. The partially completed integrated circuit includes an interlayer dielectric defining a trench and a metal having a trench portion in the trench and an overburden portion overlying the trench. The method includes performing a first CMP process and planarizing the partially completed integrated circuit in the CMP unit to remove the overburden portion of the metal. Further, the method includes performing a second CMP process and recessing the metal to form a recessed surface of the metal within the trench.

BRIEF DESCRIPTION OF THE DRAWINGS

Embodiments of methods for fabricating integrated circuits using chemical mechanical planarization to recess metal will hereinafter be described in conjunction with the following drawing figures, wherein like numerals denote like elements, and wherein.

DETAILED DESCRIPTION

Figure 1:
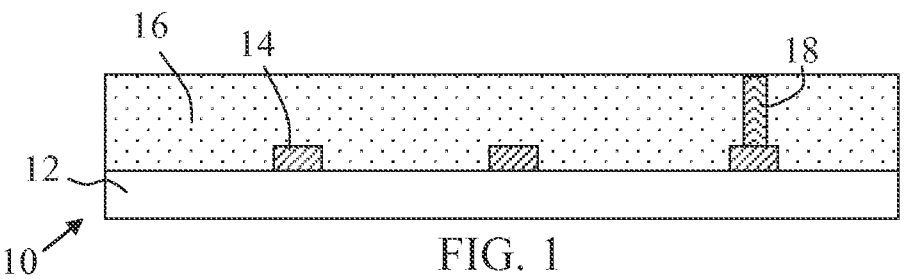
FIGS. 1-7 illustrate, in cross section, method steps for fabricating an integrated circuit in accordance with various embodiments herein.

The following detailed description is merely exemplary in nature and is not intended to limit the various embodiments of the integrated circuits or the methods for fabricating integrated circuits claimed herein. Furthermore, there is no intention to be bound by any expressed or implied theory presented in the preceding technical field, background or brief summary, or in the following detailed description. Also, additional components may be included in the integrated circuits, and additional processes may be included in the fabrication methods but are not described herein for purposes of clarity. For the purposes of explanation, numerous specific details are set forth in order to provide a thorough understanding of exemplary embodiments. It should be apparent, however, that exemplary embodiments may be practiced without these specific details or with an equivalent arrangement.

Methods for fabricating integrated circuits using chemical mechanical planarization to recess metals as described herein provide increased fabrication efficiency as compared to conventional methods. For example, in conventional integrated circuit fabrication processes, metal interconnect structures are typically formed by depositing metal over a trench formed with a dielectric material on a semiconductor substrate, introducing the semiconductor substrate to a chemical mechanical planarization (CMP) unit and planarizing the metal, transferring the semiconductor substrate from the CMP unit to a chemical etching chamber or bath and etching the metal to recess it within the trench, transferring the semiconductor substrate from the chemical etching chamber or bath to a passivation chamber and passivating the metal, and then proceeding with further dielectric material deposition for forming a cap and further interlayer materials. Embodiments described herein provide for more efficient fabrication by etching the metal within the trench with a planarization process rather than with a conventional chemical etching process. Specifically, embodiments are provided in which a chemical mechanical planarization (CMP) process is used to chemically and mechanically planarize an overburden of metal and to chemically recess the metal within a trench without mechanical contact with the metal. Further, embodiments are provided in which a metal formed on a semiconductor substrate is planarized, recessed, and passivated in a single pass through a CMP unit.

FIGS. 1-7 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Referring to FIG. 1, a method for fabricating an integrated circuit 10 generally includes providing a semiconductor substrate 12 that may be bulk silicon or a silicon on insulator (SOI) wafer. The silicon on insulator (SOI) wafer includes a silicon-containing material layer overlying a silicon oxide layer. While the semiconductor layer is preferably a silicon material, the term "silicon material" is used herein to encompass the relatively pure silicon materials typically used in the semiconductor industry as well as silicon admixed with other elements. Alternatively, the semiconductor layer can be realized as germanium, gallium arsenide, and the like, or may include a compound semiconductor such as, silicon carbide, gallium arsenide, indium arsenide, or indium phosphide. Further, the semiconductor substrate 12 may optionally include an epitaxial layer (epi layer), and/or may be strained for performance enhancement. Further, the semiconductor substrate 12 may be formed into fin structures for use in FinFETs.

As shown, semiconductor devices 14, such as transistors, diodes, resistors, capacitors and the like, are formed overlying the semiconductor substrate 12 during typical front-end-of-line (FEOL) processing. A dielectric material 16 is deposited over the semiconductor devices 14 and semiconductor substrate 12. The dielectric material 16 may be formed by CVD, spin-on, sputtering, or other suitable methods. The dielectric material 16 may include silicon oxide, silicon oxynitride, or a suitable low-k material. In an exemplary embodiment, the dielectric material 16 is tetraethyl orthosilicate oxide (TEOS).

After the dielectric material 16 has been deposited, a via contact 18 may be formed in the dielectric material 16 in a "via middle" or "middle of the line" process. Specifically, a portion of the dielectric material 16 overlying a selected semiconductor device 14 is selectively removed to form a via recess that is then filled with a metal to form the via contact 18. In an exemplary embodiment, the dielectric material 16 is removed by patterning a photoresist film over the dielectric material 16 and performing a reactive ion etch (RIE) to remove the exposed dielectric material 16. Then, metal is deposited over the partially completed integrated circuit 10 to fill the via recess and form via contact 18. The metal may be deposited by physical vapor deposition (PVD) or another suitable process. An overburden of metal may be removed by planarization.

Figure 2:
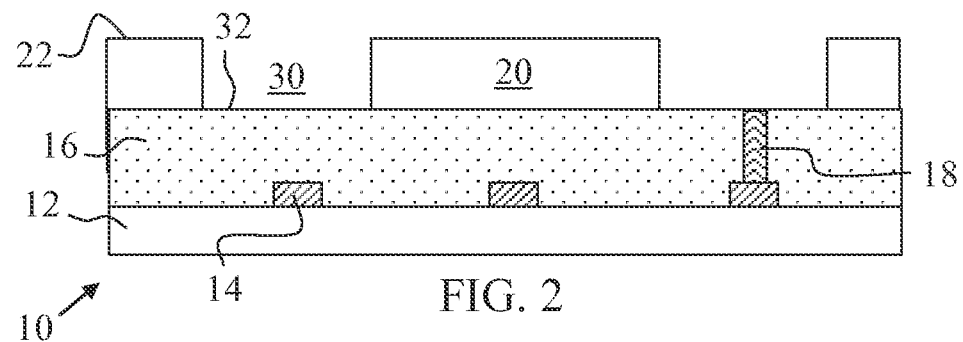

After the dielectric material 16 has been deposited and the via contacts 18 formed, the process may continue in FIG. 2 with depositing an interlayer dielectric 20. The interlayer dielectric 20 may be a low k dielectric material or other suitable material. In an exemplary embodiment, the interlayer dielectric 20 is organosilicate glass (SiCOH). Exemplary processes for depositing the interlayer dielectric include chemical vapor deposition (CVD) and plasma enhanced chemical vapor deposition (PECVD). The interlayer dielectric 20 may be planarized to have a planar upper surface 22.

As shown in FIG. 2, the interlayer dielectric 20 is etched to define trenches 30 for use in the formation of an interconnect layer. Each exemplary trench 30 has a bottom surface 32 that is formed by the dielectric material 16. In an exemplary embodiment, the interlayer dielectric 20 is removed by patterning a photoresist film over the interlayer dielectric 20 and performing a reactive ion etch (RIE) to remove the exposed interlayer dielectric 20. As shown, the exemplary etching process exposes the via contact 18 and provides for electrical connection to the via contact 18 as described below.

Figure 3:
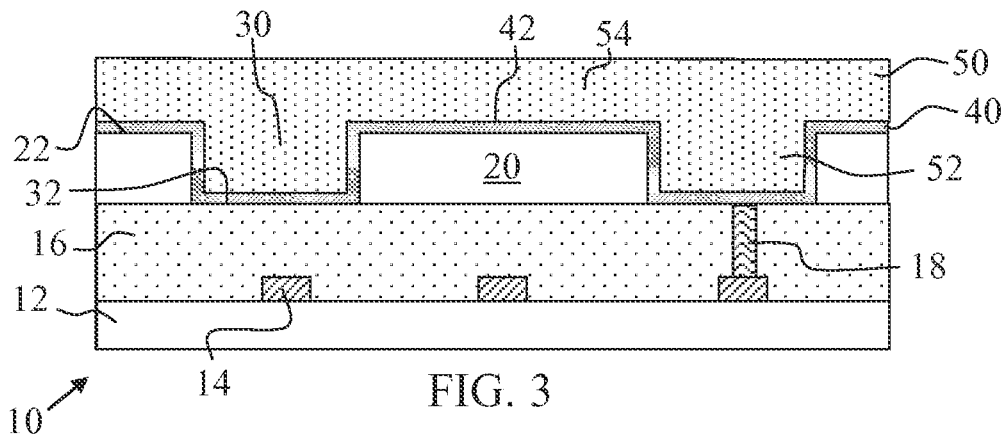

In FIG. 3, the process may continue by depositing a liner 40, such as a barrier layer, overlying the partially completed integrated circuit 10. As shown, the exemplary liner 40 is conformally deposited along the upper surface 22 of the interlayer dielectric 20, along the trench sidewalls, and along the bottom surface 32 of the trench 30 (the surface of the dielectric material 16). The liner 40 may be formed from a transition metal and may include a stack of materials. An exemplary liner 40 includes an outer layer of tantalum nitride formed on the dielectric material 16 and interlayer dielectric 20 and an inner layer of tantalum formed on the outer layer; however, the liner 40 may be formed from any suitable material or materials that provide adequate adhesion to the interlayer dielectric 20 and prevent diffusion of the later-deposited fill metal into the interlayer dielectric 20. Each material in the liner 40 may be deposited by ionized physical vapor deposition (PVD), atomic layer deposition (ALD) or another suitable process.

As shown, the liner 40 includes a surface portion 42 lying over the upper surface 22 of the interlayer dielectric 20. A fill metal 50 is deposited over the liner 40 and includes a trench portion 52 that fills the trench 30 and an overburden portion 54 outside the trench 30 and overlying the surface portion 42 of the liner 40. The fill metal 50 may be any suitable metal that provides low resistance and withstands processing conditions. In an exemplary embodiment, the fill metal 50 is copper. The fill metal 50 may be deposited by sputtering, physical vapor deposition (PVD), atomic layer deposition (ALD), or other suitable methods.

The structure of the partially completed integrated circuit 10 in FIG. 3 is thus ready for further processing to finish metal interconnects formed from the fill metal 50. Specifically, the overburden portion 54 of the fill metal 50 will be removed and the trench portion 52 of the fill metal 50 will be recessed within the trench 30. Further, the fill metal 50 will be passivated within the trench 30 and then capped with dielectric.

Figure 4:
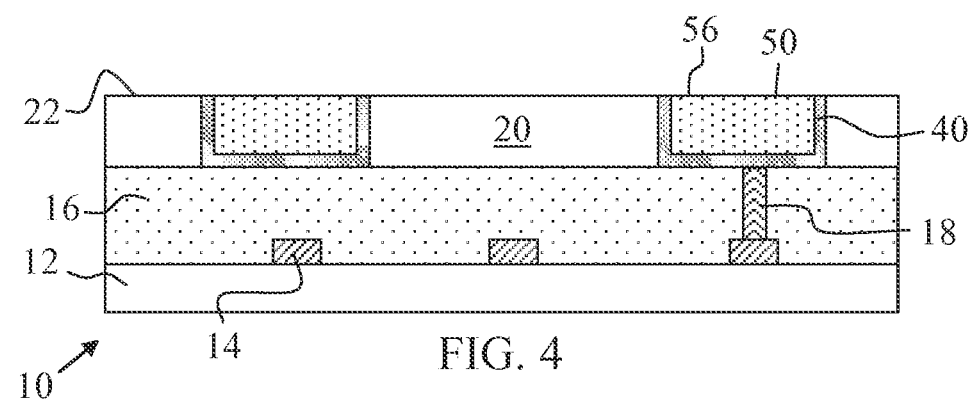

In FIG. 4, a chemical mechanical planarization (CMP) process removes the overburden portion 54 of the fill metal 50 and the surface portion 42 of the liner 40. As a result of the planarization process, the fill metal 50 is formed with an upper surface 56 that is substantially co-planar with the upper surface 22 of the interlayer dielectric 20. In an exemplary embodiment, a rotating polishing pad is brought into contact with the overburden portion 54 while an etching slurry is dispensed onto the polishing pad. As a result, the overburden portion 54 is mechanically and chemically removed. An exemplary etching slurry is selective to removing fill metal 50 and liner 40 relative to the interlayer dielectric 20 such that the exemplary etching slurry chemically attacks the fill metal 50 and liner 40, but does not chemically attack the interlayer dielectric 20. Thus, the polishing pad lands on and does not significantly remove the upper surface 22 of the interlayer dielectric 20. For example, the etching slurry may contain hydrogen peroxide. In other embodiments, the polishing pad lands on and does not remove the liner 40 such that the upper surface 56 of the fill metal 50 is co-planar with the surface portion 42 of the liner 40.

Figure 5:
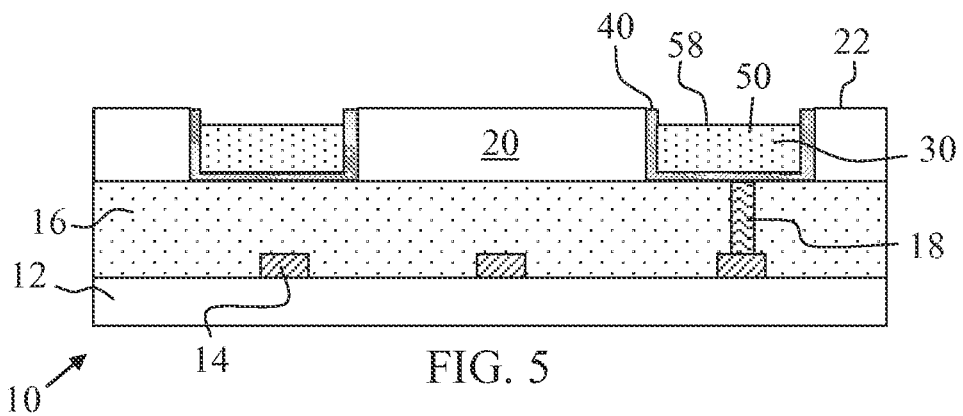

After the overburden portion 54 is removed, the process continues in FIG. 5 with the recessing of the fill metal 50. Specifically, a CMP process is performed or continued to etch the fill metal 50 within the trenches 30 to form a recessed surface 58 lower than the upper surface 56 of FIG. 4. In an exemplary embodiment, the recessed surface 58 is about 5 nanometers (nm) to about 15 nm lower than the upper surface 56, such as about 10 nm lower. The fill metal 50 is recessed within the trench 30 without mechanical interaction between a CMP polishing pad (or other mechanical planarization instrument) and the fill metal 50. For example, the polishing pad may land on the interlayer dielectric 20 and rotate without etching the interlayer dielectric 20. At the same time, the etching slurry etches the fill metal 50 within the trench 30. An exemplary etching slurry is selective to removing fill metal relative to the liner 40 and interlayer dielectric 20 and is abrasiveless, i.e., contains no particulate. The etching slurry may contain hydrogen peroxide. In an exemplary embodiment, the rotating polishing pad agitates the etching slurry to facilitate etching of the fill metal 50 through movement of the etching slurry.

Figure 6:
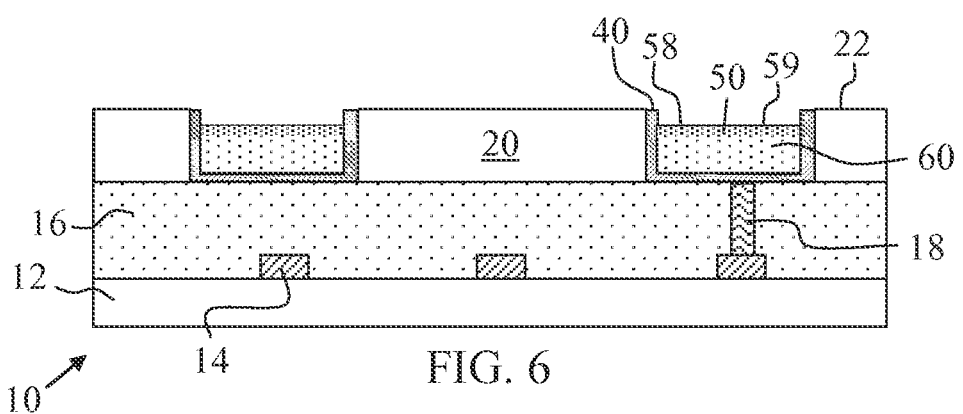
Figure 7:
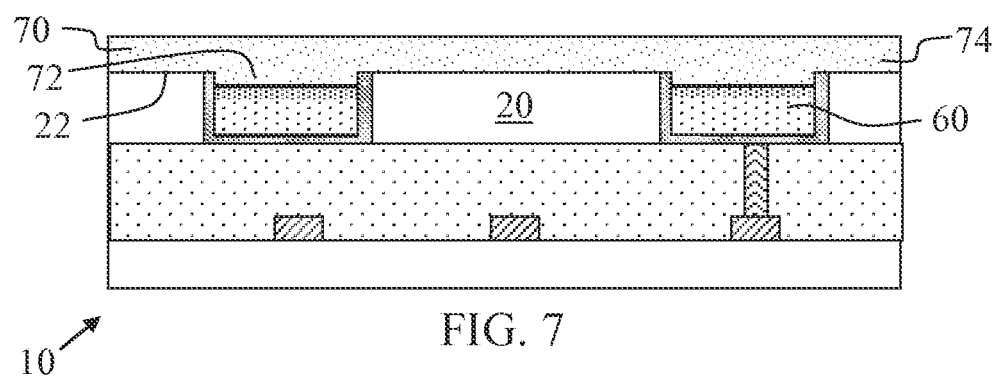

In FIG. 6, the process may continue with the passivation of the recessed surface 58 of the fill metal 50. For example, a passivating solution is introduced to the recessed surface 58 and a chemical reaction forms a passivated surface portion 59. The passivating solution may include benzotriazole (BTA) for forming polymeric passivated surface portions 59, chromic acid for forming chromate passivated surface portions 59, thiols for forming monolayer passivated surface portions 59, or other suitable passivating substances.

As a result of the processing of the fill metal 50 in FIGS. 4-6, the partially completed integrated circuit 10 of FIG. 6 is formed with interconnect structures 60 including liners 40 and fill metal 50. The interconnect structures 60 are capped in FIG. 7. As shown, a dielectric material 70 is deposited over the interconnect structures 60 and the interlayer dielectric 20. An exemplary dielectric material 70 is a low k dielectric, such as silicon carbonitrides or nitrogen doped silicon carbide. The dielectric material 70 may be conformally deposited by plasma enhanced chemical vapor deposition (PECVD) or another suitable process. The exemplary dielectric material 70 is formed with a trench portion 72 and an overburden portion 74 formed over the upper surface 22 of the interlayer dielectric 20. Further BEOL processing may be performed on the partially completed integrated circuit 10 of FIG. 7, including formation of various layers of dielectric and metal lines and vias for forming electrical connection of interconnect structures and other devices.

Figure 8:
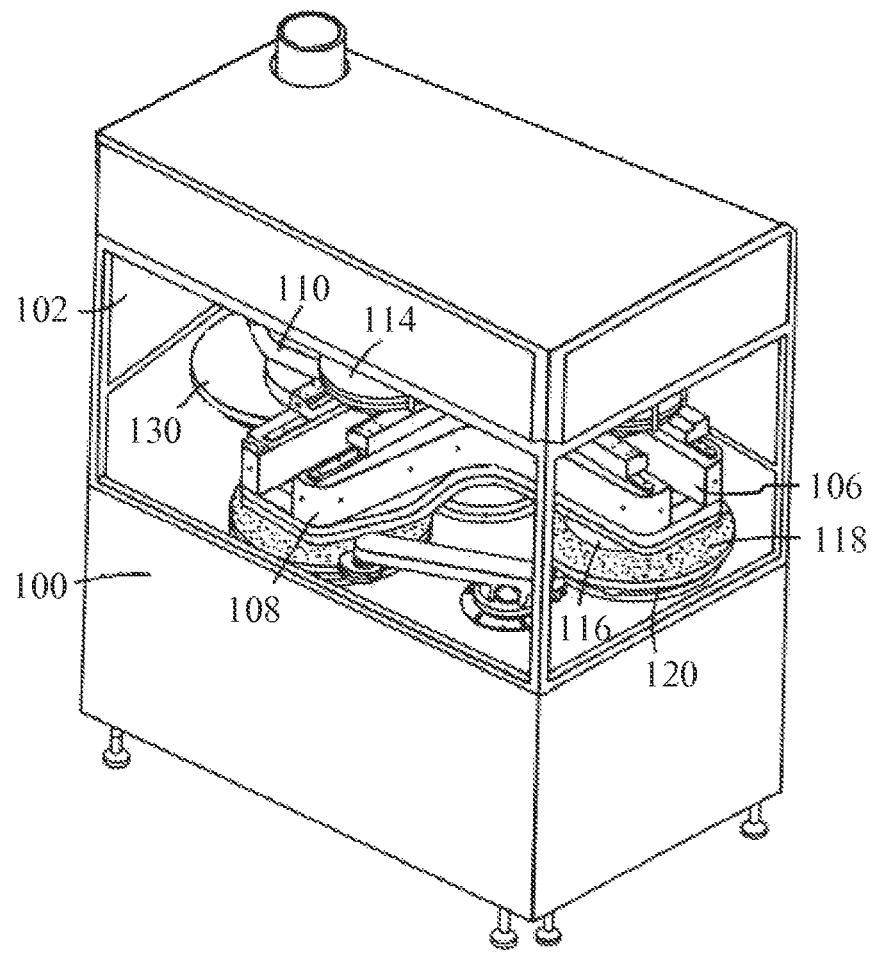
FIG. 8 illustrates, in perspective, an exemplary chemical mechanical planarization unit for planarizing, recessing, and passivating metal during fabrication of an integrated circuit in accordance with various embodiments herein.

FIGS. 1-7 describe an embodiment of a method for fabricating an integrated circuit 10 using chemical mechanical planarization to recess metal. FIG. 8 illustrates a typical chemical mechanical planarization (CMP) apparatus or unit 100 for performing the metal planarization, recessing, and passivating processes described above. As shown, the CMP apparatus 100 includes a controlled mini-environment 102 holding a first station 106, a second station 108 and a third station 110. A cross head 114 is provided to transfer semiconductor substrates from station to station.

First station 106 and second station 108 are provided to perform chemical mechanical planarization processes, and each includes a polishing head 116 mounted and rotated by a motor (not shown). A semiconductor substrate may be mounted on the polishing head 116 with the surface to be polished mounted in a face-down position (not shown). During a polishing operation, the polishing head 116 may be moved longitudinally along the cross head 114 in a linear motion across the surface of a polishing pad 118. As shown in FIG. 8, the polishing pad 118 is mounted on a polishing disc 120 rotated by a motor (not shown) in a direction opposite to the rotational direction of the polishing head 116.

In addition to stations 106 and 108, the CMP apparatus 100 includes a third station 110 that is provided for passivating metal layers on the semiconductor substrates after planarization processes are completed in the other stations. As shown, the third station 110 includes a passivation zone 130 where a semiconductor substrate is received and is treated with a passivating composition.

During an integrated circuit fabrication process in accordance with embodiments herein, a partially completed integrated circuit 10 having the structure shown in FIG. 3, i.e., with a metal trench portion and overburden portion, is introduced to the CMP apparatus 100. Specifically, the semiconductor substrate is positioned in the first station 106 and is mounted on polishing head 116. The overburden portion of metal is planarized by the rotating polishing pad 118 as the polishing pad is rotated by polishing disc 120. The CMP apparatus 100 dispenses a slurry onto the interface between the polishing pad 118 and the semiconductor substrate. Together, the slurry and the polishing pad 118 affect chemical mechanical planarization of the metal as described in relation to FIG. 4.

The partially completed integrated circuit is then moved to the second station 108 where the semiconductor substrate is mounted on the second station's polishing head. The second station's polishing pad is rotated and brought into contact with the upper surface of the partially completed integrated circuit while an etching slurry, which may be the same slurry used in the first station or a different slurry from that used in the first station, is dispensed onto the interface between the partially completed integrated circuit and the polishing pad. As noted above in reference to FIG. 5, the etching slurry chemically etches the metal within the trench to recess the metal while the polishing pad ineffectually contacts the dielectric material around the trench. As a result, a chemical, non-mechanical etch is performed at the second station 108 of the CMP apparatus 100.

After the metal is chemically recessed in the second station 108, the partially completed integrated circuit 10 continues its movement through the CMP apparatus 100 from the second station 108 to the third station 110. At the third station 110, a passivation composition is contacted with the recessed surface of the metal to form a passivation layer as discussed above in relation to FIG. 6. After passivating the recessed surface of the metal, formation of the metal contact structure is finished and the partially completed integrated circuit is unloaded from the CMP apparatus 100. Thereafter, the metal contact structures may be capped with dielectric.

FIG. 8 illustrates that the formation of the metal contact structure, including removal of the metal overburden, recessing of the metal within the trench, and passivation of the recessed surface of the metal, may be wholly performed during a single pass through a CMP apparatus 100. As a result, movement of the semiconductor substrate during processing is reduced and logistics simplified. Further, the efficiency of integrated circuit fabrication is improved.

The methods for fabricating integrated circuits described herein provide for faster throughput for semiconductor substrates as a result of improved process efficiency. Also, processes including chemical mechanical planarization, recess formation by chemical etching, and passivation may be performed during a single pass through a CMP apparatus, enabling a reduction in the fabrication process footprint.

To briefly summarize, the fabrication methods described herein provide for improved efficiency. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   forming a trench with a first sidewall and a second sidewall;
   filling the trench with a metal and forming an overburden portion of the metal outside of the trench;
   performing a first planarization process with an etching slurry to remove the overburden portion of the metal; and
   performing a second planarization process with an abrasiveless etching slurry to recess the metal within the trench, form a recessed surface extending from the first sidewall to the second sidewall, and expose a portion of the first sidewall and a portion of the second sidewall; wherein performing the second planarization process with the abrasiveless etching slurry comprises lowering a surface of the metal within the trench by about 5 nm to about 15 nm to the recessed surface.

2. The method of claim 1 wherein performing the planarization process with the etching slurry to remove the overburden portion of the metal and to recess the metal within the trench comprises mechanically polishing the overburden portion of the metal; and wherein performing the second planarization process with the abrasiveless etching slurry to recess the metal within the trench comprises non-mechanically etching the metal within the trench.

3. The method of claim 1 wherein performing the first planarization process with the etching slurry to remove the overburden portion of the metal comprises mechanically polishing the overburden portion of the metal with a polishing pad and the etching slurry; and wherein performing the second planarization process with the abrasiveless etching slurry to recess the metal within the trench comprises etching the metal within the trench with the abrasiveless etching slurry while agitating the abrasiveless etching slurry with the polishing pad.

4. The method of claim 1 further comprising: forming an interlayer dielectric overlying an object to be contacted, wherein the interlayer dielectric has an upper surface and wherein forming the trench with the first sidewall and the second sidewall comprises etching the trench in the interlayer dielectric over the object to be contacted.

5. The method of claim 4 wherein performing the first planarization process with the etching slurry to remove the overburden portion of the metal comprises mechanically polishing the overburden portion of the metal with a polishing pad and the etching slurry and landing the polishing pad on the upper surface of the interlayer dielectric; and wherein performing the second planarization process with the abrasiveless etching slurry to recess the metal within the trench comprises etching the metal within the trench with the abrasiveless etching slurry while agitating the abrasiveless etching slurry with the polishing pad.

6. The method of claim 4 further comprising forming a liner overlying the upper surface and trench formed in the interlayer dielectric, wherein performing the first planarization process with the etching slurry to remove the overburden portion of the metal comprises mechanically polishing the overburden portion of the metal with a polishing pad and the etching slurry and landing the polishing pad on the liner; and wherein performing the second planarization process with the abrasiveless etching slurry to recess the metal within the trench comprises etching the metal within the trench with the abrasiveless etching slurry while agitating the abrasiveless etching slurry with the polishing pad.

7. A method for fabricating an integrated circuit, the method comprising:
   providing a partially completed integrated circuit including an interlayer dielectric having a first trench sidewall and a second trench sidewall defining a trench;
   filling the trench with copper; and
   recessing the copper within the trench with a chemical mechanical planarization (CMP) process performed with an abrasiveless etching slurry to a recessed surface within the trench extending from the first trench sidewall to the second trench sidewall, wherein the copper within the trench is non-mechanically etched by the abrasiveless etching slurry.

8. The method of claim 7 wherein recessing the copper within the trench comprises:
   landing a CMP polishing pad on the interlayer dielectric; and
   rotating the CMP polishing pad on the interlayer dielectric without etching the interlayer dielectric.

9. The method of claim 7 further comprising lining the trench and an upper surface of the interlayer dielectric with a barrier layer, wherein recessing the copper within the trench with a chemical mechanical planarization (CMP) process comprises:
   landing a CMP polishing pad on the barrier layer; and
   rotating the CMP polishing pad on the barrier layer without removing the barrier layer.

10. The method of claim 7 recessing the copper within the trench comprises lowering a surface of the metal to the recessed surface within the trench by about 5 nm to about 15 nm.

11. A method for fabricating an integrated circuit, the method comprising:
   introducing a partially completed integrated circuit to a chemical mechanical planarization (CMP) unit, wherein the partially completed integrated circuit includes an interlayer dielectric defining a trench and a metal having a trench portion in the trench and an overburden portion overlying the trench;
   performing a first CMP process with a first etching slurry and planarizing the partially completed integrated circuit in the CMP unit to remove the overburden portion of the metal and form a planarized surface of the trench portion of the metal; and performing a second CMP process with an abrasiveless etching slurry and recessing the metal to remove all of the planarized surface of the trench portion of the metal and to form a recessed surface of the metal within the trench.

12. The method of claim 11 wherein: performing a second CMP process and recessing the metal to form a recessed surface of the metal within the trench comprises forming the recessed surface about 5 nm to about 15 nm lower than the planarized surface.

13. The method of claim 11 wherein the abrasiveless etching slurry contains hydrogen peroxide.

14. The method of claim 11 further comprising passivating the recessed surface of the metal in the CMP unit.

15. The method of claim 14 wherein:
the CMP unit includes a first station, a second station and a third station;
performing a first CMP process comprises performing the first CMP process at the first station;
performing at second CMP process comprises performing the second CMP process at the second station; and
passivating the recessed surface of the metal comprises passivating the recessed surface of the metal at the third station.

16. The method of claim 11 wherein:
performing a first CMP process with a first etching slurry and planarizing the partially completed integrated circuit in the CMP unit to remove the overburden portion of the metal comprises mechanically polishing the overburden portion of the metal; and
performing a second CMP process with an abrasiveless etching slurry and recessing the metal to remove all of the planarized surface of the trench portion of the metal and to form a recessed surface of the metal within the trench comprises landing a CMP polishing pad on the interlayer dielectric, rotating the CMP polishing pad on the interlayer dielectric without etching the interlayer dielectric, and non-mechanically etching the metal within the trench with the abrasiveless etching slurry.

17. The method of claim 11 wherein:
performing a first CMP process with a first etching slurry and planarizing the partially completed integrated circuit in the CMP unit comprises mechanically polishing the overburden portion of the metal with a polishing pad and an etching slurry; and performing a second CMP process with an abrasiveless etching slurry and recessing the metal to remove all of the planarized surface of the trench portion of the metal and to form a recessed surface of the metal within the trench comprises etching the metal within the trench with the abrasiveless etching slurry while agitating the abrasiveless etching slurry with the polishing pad.

18. The method of claim 11 wherein:
performing a first CMP process with a first etching slurry and planarizing the partially completed integrated circuit in the CMP unit comprises mechanically polishing the overburden portion of the metal with a first polishing pad and an etching slurry and landing the first polishing pad on an upper surface of the interlayer dielectric; and performing a second CMP process with an abrasiveless etching slurry and recessing the metal to remove all of the planarized surface of the trench portion of the metal and to form a recessed surface of the metal within the trench comprises etching the metal within the trench with the abrasiveless etching slurry while agitating the abrasiveless etching slurry with a second polishing pad.

19. The method of claim 11 wherein:
the partially completed integrated circuit includes a liner overlying the trench and an upper surface of the interlayer dielectric;
performing a first CMP process with a first etching slurry and planarizing the partially completed integrated circuit in the CMP unit comprises mechanically polishing the overburden portion of the metal with a first polishing pad and an etching slurry and landing the first polishing pad on the liner; and performing a second CMP process with an abrasiveless etching slurry and recessing the metal to remove all of the planarized surface of the trench portion of the metal and to form a recessed surface of the metal within the trench comprises rotating a second polishing pad on the liner without removing the liner and etching the metal within the trench with the abrasiveless etching slurry while agitating the abrasiveless etching slurry with the second polishing pad.

* * * * *